US011691313B2

(12) United States Patent
Rikiishi et al.

(10) Patent No.: US 11,691,313 B2
(45) Date of Patent: Jul. 4, 2023

(54) PROCESSING APPARATUS INCLUDING A WATER COLLECTION PAN

(71) Applicant: DISCO CORPORATION, Tokyo (JP)

(72) Inventors: Toshiyasu Rikiishi, Tokyo (JP); Yasushi Katagiri, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 225 days.

(21) Appl. No.: 16/745,614

(22) Filed: Jan. 17, 2020

(65) Prior Publication Data

US 2020/0238570 A1 Jul. 30, 2020

(30) Foreign Application Priority Data

Jan. 30, 2019 (JP) .............................. JP2019-013838

(51) Int. Cl.
*H01L 21/304* (2006.01)
*B28D 5/00* (2006.01)
*H01L 21/67* (2006.01)

(52) U.S. Cl.
CPC ........ *B28D 5/0047* (2013.01); *H01L 21/3043* (2013.01); *H01L 21/67092* (2013.01); *H01L 21/6704* (2013.01)

(58) Field of Classification Search
CPC ............ B28D 5/0047; H01L 21/67092; H01L 21/3043; H01L 21/6704; H01L 21/67028; H01L 21/67034; H01L 21/67046; H01L 21/67057; H01L 21/6705; B24B 9/065; B08B 3/14
See application file for complete search history.

(56) References Cited

U.S. PATENT DOCUMENTS

| 6,119,736 A | * | 9/2000 | Huang .............. H01L 21/67724 141/86 |
| 9,127,395 B2 | * | 9/2015 | Kim ....................... D06F 39/081 |
| 2005/0172678 A1 | * | 8/2005 | Kim ....................... A47B 91/005 68/3 R |
| 2006/0081014 A1 | * | 4/2006 | Choi ..................... D06F 39/081 68/3 R |
| 2010/0270009 A1 | * | 10/2010 | Kim ..................... F24D 17/0005 165/104.19 |
| 2012/0102638 A1 | * | 5/2012 | Al-Mahnna .............. A47K 1/02 4/626 |
| 2012/0222999 A1 | * | 9/2012 | Ha .......................... C02F 1/008 210/175 |
| 2015/0158137 A1 | * | 6/2015 | Mori ...................... B24B 57/02 451/73 |
| 2018/0308718 A1 | * | 10/2018 | Breingan ................. B08B 3/02 |

FOREIGN PATENT DOCUMENTS

| JP | H09207047 | * | 8/1997 | |
| JP | 2016221620 A | | 2/2012 | |
| JP | 2016221620 A | * | 12/2016 | .............. F16M 1/00 |

OTHER PUBLICATIONS

English translation of JP 2016-221620, provided by JPLAT (Year: 2016).*

* cited by examiner

*Primary Examiner* — Walter H Swanson
(74) *Attorney, Agent, or Firm* — Greer, Burns & Crain, Ltd.

(57) ABSTRACT

A processing apparatus includes a chuck table for holding a workpiece, a processing unit for processing the workpiece held on the chuck table as supplying a processing water to the workpiece, and a water pan fixed to a bottom of the processing apparatus for receiving the processing water as a water leaked.

9 Claims, 3 Drawing Sheets ical part of the cutting apparatus, illustrating a manner of mounting

PROCESSING APPARATUS INCLUDING A WATER COLLECTION PAN

BACKGROUND OF THE INVENTION

Field of the Invention

The present invention relates to a processing apparatus including a water pan for receiving a water leaked at a bottom of the processing apparatus.

Description of the Related Art

A plurality of devices such as integrated circuits (ICs) and large scale integrations (LSIs) are formed on a front side of a wafer so as to be separated from each other by a plurality of crossing division lines. A back side of the wafer thus having the plural devices on the front side is ground by a grinding apparatus to reduce a thickness of the wafer to a predetermined thickness. Thereafter, the wafer is divided into individual device chips respectively corresponding to the plural devices, by using a dicing apparatus. The device chips thus obtained are used in electrical equipment such as mobile phones and personal computers.

A processing apparatus including such a grinding apparatus and a dicing apparatus uses a processing water such as a grinding water and a cutting water in a processing operation. Accordingly, there is a possibility that the processing water may leak. To cope with this problem, there is a case that a water pan is provided directly below the processing apparatus, so as to receive the processing water leaked and prevent the leaked water from spreading to a peripheral area outside the processing apparatus (see Japanese Patent Laid-Open No. 2016-221620, for example).

SUMMARY OF THE INVENTION

In the case of setting the water pan below the processing apparatus, the water pan and the processing apparatus are separately prepared. The water pan is first set on a floor, and the processing apparatus is next mounted on the water pan. Accordingly, in the case that the processing apparatus is directly set on the floor without setting the water pan, it is necessary to once lift the processing apparatus from the floor, next insert the water pan into a space defined between the floor and the processing apparatus, and finally mount the processing apparatus on the water pan, thus causing a troublesome or extensive operation. Also, in the case that the water pan is previously set below the processing apparatus, there is another problem such that the processing apparatus and the water pan must be separately moved in changing the position of the processing apparatus, so that much effort is required for position adjustment between the processing apparatus and the water pan.

It is therefore an object of the present invention to provide a processing apparatus which can eliminate the necessity of separately setting a water pan in setting the processing apparatus requiring the water pan.

In accordance with an aspect of the present invention, there is provided a processing apparatus including a chuck table for holding a workpiece; processing means for processing the workpiece held on the chuck table as supplying a processing water to the workpiece; and a water pan fixed to a bottom of the processing apparatus for receiving the processing water as a water leaked.

Preferably, the processing apparatus further includes a plurality of legs provided at the bottom of the processing apparatus; the water pan being fixed through the legs to the bottom of the processing apparatus. Preferably, the processing apparatus further includes a water leakage sensor for detecting the leakage of the processing water. The water pan has a bottom wall inclined with respect to a horizontal plane, and the water leaked to the water pan is collected at a predetermined low position set on the bottom wall of the water pan. The water leakage sensor is provided at the predetermined low position to detect the processing water collected at the predetermined low position. More preferably, the processing apparatus further includes water discharging means for discharging the processing water leaked to the water pan, the water discharging means being provided on the water pan at a position corresponding to the predetermined low position.

The term "processing water" in the present invention includes any water for use in the processing apparatus. For example, the processing water includes a cutting water for use in a cutting apparatus, a grinding water for use in a grinding apparatus, and a cleaning water for cleaning a workpiece.

According to the processing apparatus of the present invention, it is unnecessary to perform any extensive operation such that the processing apparatus is lifted by using a crane or the like, so as to set the water pan, and the water pan is next inserted into a space below the processing apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
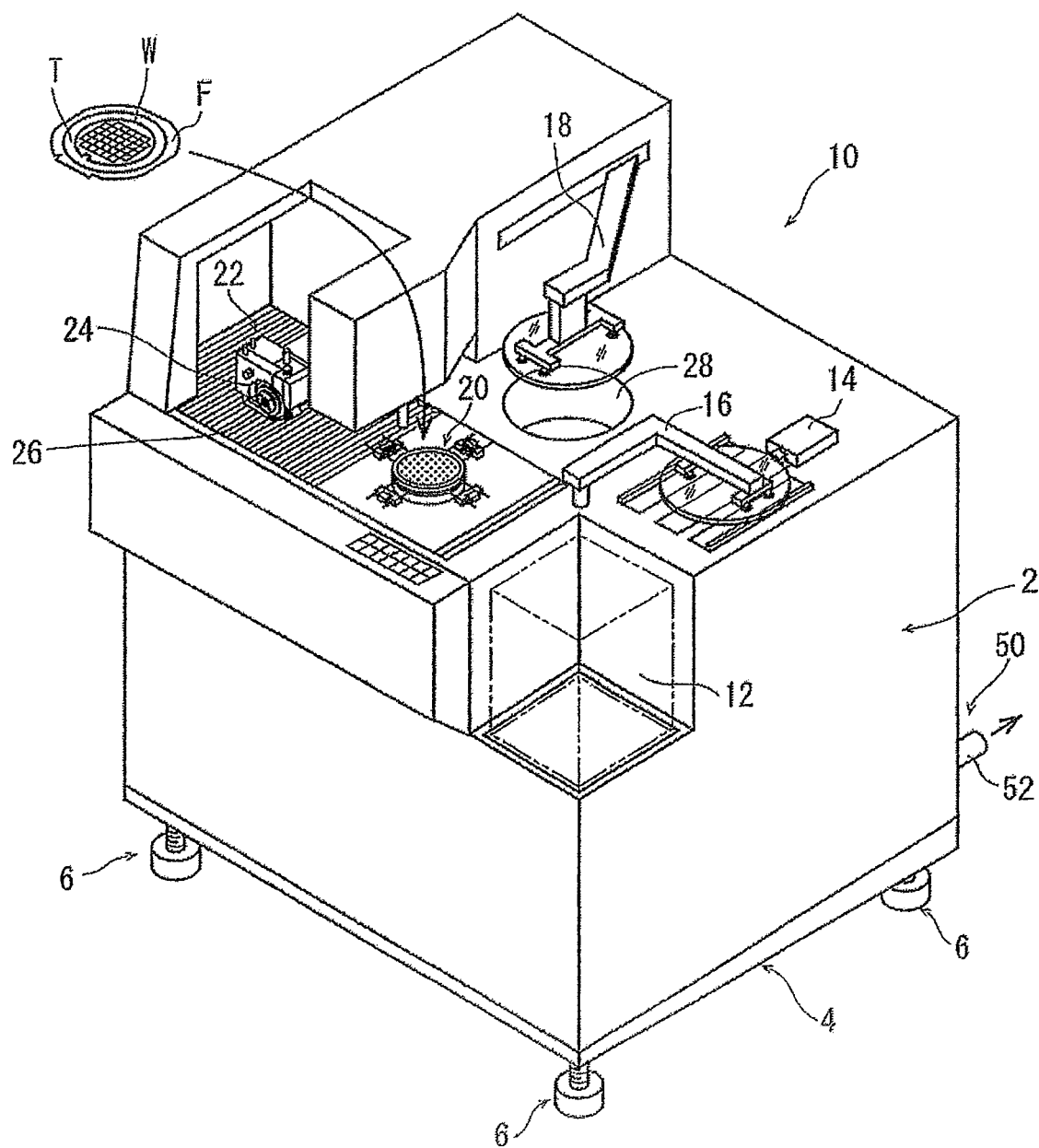
FIG. 1 is a perspective view of a cutting apparatus including a water pan.

A preferred embodiment of the present invention will now be described in detail with reference to the attached drawings. FIG. 1 is a perspective view of a cutting apparatus (dicing saw) 10 according to the preferred embodiment. The cutting apparatus 10 includes a housing 2 having a rectangular bottom, a cassette 12 placed at a predetermined position on the housing 2 and adapted to be vertically moved, handling means 14 for drawing a semiconductor wafer W as a workpiece from the cassette 12 before processing and storing the semiconductor wafer W into the cassette 12 after processing, a chuck table 20 for holding the semiconductor wafer W, first transfer means 16 for transferring the semiconductor wafer W drawn from the cassette 12 to the chuck table 20, cutting means 22 for cutting the semiconductor wafer W held on the chuck table 20, the cutting means 22 having a cutting blade 24 and cutting water supplying means 26, cleaning means 28 for cleaning the semiconductor wafer W cut by the cutting means 22, second transfer means 18 for transferring the semiconductor wafer W from the chuck table 20 to a cleaning area where the semiconductor wafer W is to be cleaned by the cleaning means 28, a water pan 4 fixed to a bottom of the cutting apparatus 10, that is, a bottom of the housing 2, for receiving a water leaked, and a plurality of legs 6 provided at the four corners of the bottom of the housing 2 and threadedly engaged with the housing 2 to fix the water pan 4 to the housing 2.

The semiconductor wafer W to be cut by the cutting apparatus 10 is supported through a protective tape T to a ring frame F. A plurality of semiconductor wafers W each supported through the protective tape T to the ring frame F are previously stored in the cassette 12 so as to be arranged at given intervals in a vertical direction. The plural semiconductor wafers W are drawn one by one from the cassette 12 by operating the handling means 14. Thereafter, each semiconductor wafer W is held under suction by the first transfer means 16 and transferred to the chuck table 20 by horizontally swinging the first transfer means 16 about a vertical axis. Thereafter, the semiconductor wafer W is held under suction on the chuck table 20.

After holding the semiconductor wafer W on the chuck table 20 under suction, the chuck table 20 is moved toward the position below the cutting means 22 by operating moving means (not illustrated). During the movement of the chuck table 20, alignment between the semiconductor wafer W and the cutting blade 24 is performed by alignment means (not illustrated). Thereafter, the semiconductor wafer W is cut by the cutting blade 24 as the chuck table 20 is moved. This cutting step is performed in such a manner that the semiconductor wafer W is cut along all of the division lines formed on the semiconductor wafer W to thereby divide the semiconductor wafer W into individual device chips. That is, the cutting operation of cutting the semiconductor wafer W along each division line is repeated as changing the relative position between the chuck table 20 and the cutting blade 24 and changing the direction of extension of the division lines. At this time, a cutting water is supplied from the cutting water supplying means 26 to the cutting blade 24 and a cutting position on the semiconductor wafer W.

After finishing the cutting step to divide the semiconductor wafer W into the individual device chips, the chuck table 20 is moved to the original position and the second transfer means 18 is next operated to transfer the semiconductor wafer W from the chuck table 20 to the cleaning means 28. The semiconductor wafer W is cleaned by the cleaning means 28 in the following manner. The semiconductor wafer W is placed on a holding table (not illustrated) included in the cleaning means 28 and then held on the holding table under suction. Thereafter, the holding table is rotated and a cleaning water is supplied from cleaning water supplying means (not illustrated) to the semiconductor wafer W from an upper side thereof, thereby cleaning cutting dust off the semiconductor wafer W. Thereafter, the semiconductor wafer W is dried by performing a suitable step. Thereafter, the semiconductor wafer W is transferred by the first transfer means 16 and then stored into the cassette 12 by the handling means 14. Thus, the cutting operation for one of the plural semiconductor wafers W stored in the cassette 12 is ended.

There are provided in the housing 2 covering a lower portion of the cutting apparatus 10 drive sources (not illustrated) for driving the handling means 14 and the first transfer means 16, moving means (not illustrated) for moving the chuck table 20, and elevating means (not illustrated) for vertically moving the cassette 12. Further, there are also provided in the housing 2 a cutting water supplying circuit (not illustrated) for supplying the cutting water to a cutting area where the semiconductor wafer W is to be cut by the cutting blade 24 and discharging the cutting water used for cutting of the semiconductor wafer W to the outside of the cutting apparatus 10 and a cleaning water supplying circuit (not illustrated) for supplying the cleaning water to the cleaning means 28 and discharging the cleaning water used for cleaning of the semiconductor wafer W to the outside of the cutting apparatus 10. The cutting water supplying circuit includes a water passage and pipe for supplying and discharging the cutting water. Similarly, the cleaning water supplying circuit includes a water passage and pipe for supplying and discharging the cleaning water. In a normal operating condition, there is no possibility that the cutting water and the cleaning water may leak from the cutting water supplying circuit and the cleaning water supplying circuit. However, when a hole or crack, for example, is formed at any position in the cutting water supplying circuit or the cleaning water supplying circuit, the cutting water or the cleaning water may leak to the outside of the cutting apparatus 10. Further, the cutting water supplying circuit or the cleaning water supplying circuit may be clogged with any foreign matter to cause overflow from an unintentional position. In these cases, the cutting water or the cleaning water leaks from the cutting water supplying circuit or the cleaning water supplying circuit and then flows down through any path in the housing 2 to reach the bottom of the housing 2.

According to the preferred embodiment, the water pan 4 for receiving the water leaked is fixed to the bottom of the cutting apparatus 10. More specifically, the water pan 4 is fixed to the bottom of the housing 2 of the cutting apparatus 10 at the four corners of the bottom of the housing 2 where four legs 6 are provided. That is, the water pan 4 is fixed through the four legs 6 to the four corners of the bottom of the housing 2. Accordingly, the cutting water and the cleaning water leaked in the housing 2 can be received by the water pan 4.

Figure 2:
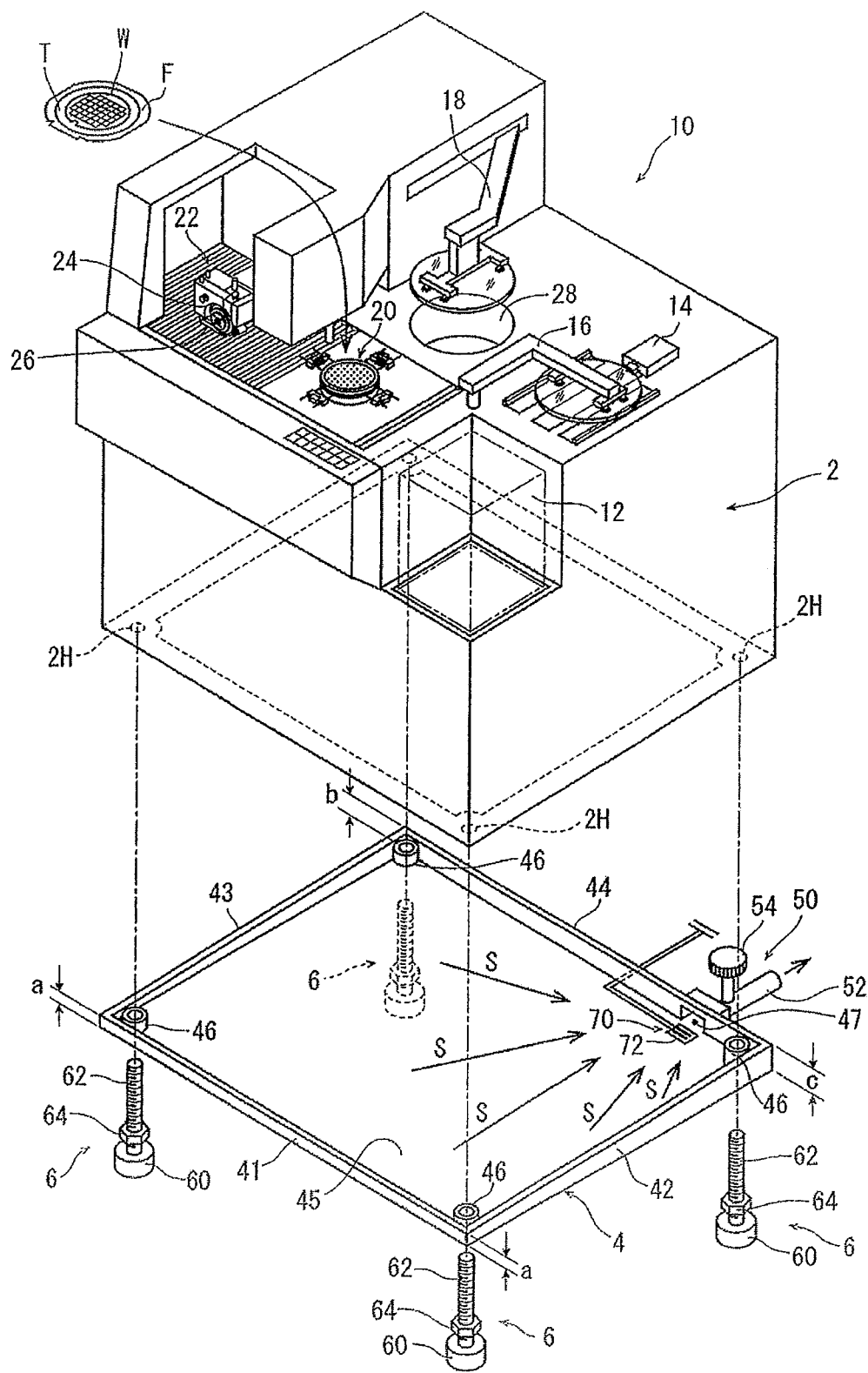
FIG. 2 is a partially exploded perspective view of the cutting apparatus illustrated in FIG. 1.

The structure of the water pan 4 will now be described with reference to FIG. 2. As illustrated in FIG. 2, the water pan 4 is fixed to the bottom of the housing 2 constituting a lower portion of the cutting apparatus 10. The water pan 4 includes a front wall 41, a side wall 42 connected to the front wall 41, another side wall 43 connected to the front wall 41, a rear wall 44 connected to both the side wall 42 and the side wall 43 and opposed to the front wall 41, and a bottom wall 45 provided so as to close a rectangular area surrounded by the front wall 41, the side wall 42, the side wall 43, and the rear wall 44. That is, the bottom wall 45 is connected to all of the front wall 41, the side wall 42, the side wall 43, and the rear wall 44 in such a manner that these walls 41 to 44 rise from the peripheral edge of the bottom wall 45.

In the condition where the water pan 4 is fixed to the bottom of the cutting apparatus 10, the bottom wall 45 is inclined downward with respect to a horizontal plane as illustrated by a plurality of arrows S in FIG. 2. Accordingly, the water leaked to the water pan 4 flows along the arrow S to be collected at a predetermined low position on the bottom wall 45. A detecting portion 72 of a water leakage sensor 70 is provided at this predetermined low position. As illustrated in FIG. 2, the bottom wall 45 is inclined with respect to a horizontal plane, so that a depth "b" of the corner formed by the rear wall 44 and the side wall 43 is larger than a depth "a" of the corner formed by the front wall 41 and the side wall 42 and the depth "a" of the corner formed by the front wall 41 and the side wall 43. Further, a depth "c" of the corner formed by the rear wall 44 and the side wall 42 is larger than the depth "b." In addition, the predetermined low position where the water leakage sensor 70 is provided is set near the corner formed by the rear wall 44 and the side wall 42 so as to be opposed to the rear wall 44. The configuration of the water leakage sensor 70 is not specially limited. For example, the water leakage sensor 70 may be configured in such a manner that the detecting portion 72 has two electrodes and a processing water (cutting water or cleaning water) is adapted to come into contact with the two electrodes, whereby when the processing water comes into contact with the two electrodes, a current passes through the processing water to thereby detect that the processing water has leaked to the water pan 4. With this configuration, even when water leakage has occurred at any position on the bottom of the cutting apparatus 10, the processing water leaked can be collected at the predetermined low position where the detecting portion 72 of the water leakage sensor 70 is provided, so that the water leakage can be quickly detected. Further, any suitable circuit for operating a buzzer and/or a warning lamp may be formed. In this case, when the water leakage is detected by the water leakage sensor 70, either of or both the buzzer and the warning lamp may be operated. Further, in this case, an electrical signal as a warning signal indicating the water leakage may be transmitted to control means (not illustrated) for the cutting apparatus 10 to thereby stop the cutting operation in case of emergency.

As illustrated in FIG. 2, a water discharge hole 47 for discharging the water leaked is formed through the rear wall 44 at a position opposed to the predetermined low position on the bottom wall 45 where the detecting portion 72 of the water leakage sensor 70 is provided. Water discharging means 50 is connected to the outside surface of the rear wall 44 at the position where the water discharge hole 47 is formed. The water discharging means 50 includes a discharge pipe 52 and a cock 54 for opening and closing a passage in the discharge pipe 52. Accordingly, when the water leaked is accumulated in the water pan 4, the cock 54 is opened to thereby discharge the leaked water from the discharge pipe 52. While the water discharge hole 47 is formed through the rear wall 44 in the preferred embodiment, the position of the water discharge hole 47 is not limited to the preferred embodiment. For example, the water discharge hole 47 may be formed through the bottom wall 45 at the position where the water leakage sensor 70 is provided. Further, the predetermined low position on the bottom wall 45 is not limited to the position opposed to the rear wall 44 as illustrated in FIG. 2, and may be set to any arbitrary position.

As illustrated in FIG. 2, four bosses 46 are formed at the four corners of the water pan 4 so as to project upward from the bottom wall 45. The four bosses 46 are used to fix the water pan 4 to the bottom of the cutting apparatus 10. More specifically, the water pan 4 is fixed through the four bosses 46 to the bottom of the housing 2 of the cutting apparatus 10 by using the four legs 6. As illustrated in FIG. 2, the bottom wall 45 of the water pan 4 is inclined with respect to a horizontal plane, and a height of each of the side wall 42, the side wall 43, and the rear wall 44 is different according to a horizontal position. Accordingly, the height of the boss 46 formed at the corner between the front wall 41 and the side wall 42 or the side wall 43 is different from the height of the boss 46 formed at the corner between the side wall 43 and the rear wall 44 and also different from the height of the boss 46 formed at the corner between the side wall 42 and the rear wall 44.

Figure 3:
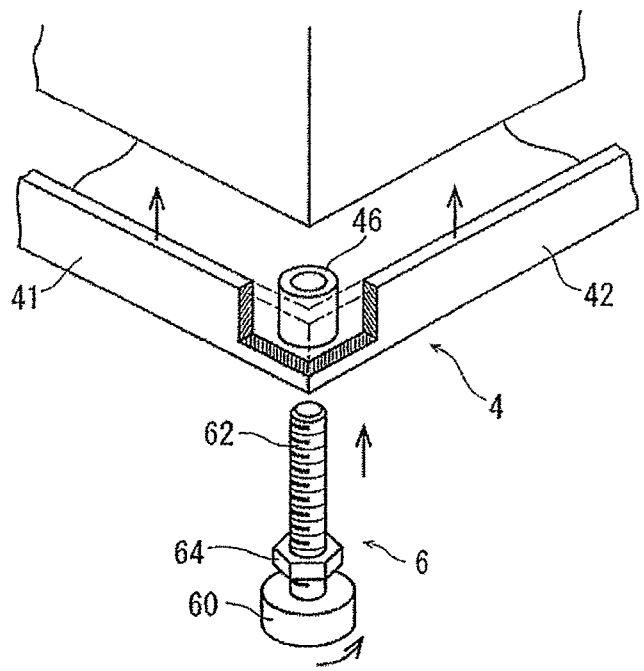
FIG. 3 is an enlarged perspective view of an essential part of the cutting apparatus, illustrating a manner of mounting the water pan to a bottom of the cutting apparatus.

A fixing structure using the legs 6 for fixing the water pan 4 to the housing 2 will now be described with reference to FIGS. 2 to 4B. FIG. 3 is a partially cut-away perspective view illustrating the fixing structure at the corner between the front wall 41 and the side wall 42, in which a part of the corner is cut away for convenience of explanation. As illustrated in FIG. 3, each leg 6 includes a base 60 adapted to come into contact with a floor surface at a place where the cutting apparatus 10 is set, a threaded portion 62 integrally formed with the base 60 and having an external thread, and a tightening nut 64 threadedly engaged with the threaded portion 62. An axial length of the threaded portion 62 of each leg 6 is larger than the height of the highest one of the four bosses 46 of the water pan 4, that is, the height of the boss 46 formed at the corner between the rear wall 44 and the side wall 42 of the water pan 4.

Figure 4A:
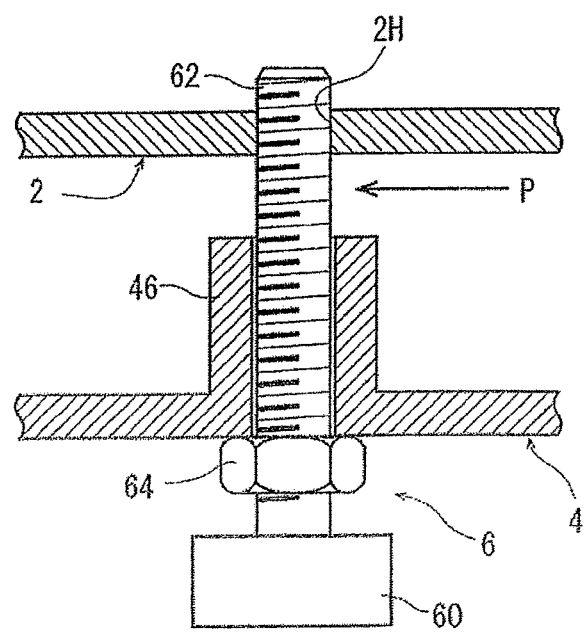
FIG. 4A is an enlarged sectional view of an essential part of the cutting apparatus, illustrating a condition that the water pan has been mounted through a leg to the cutting apparatus.

In mounting the water pan 4 to the bottom of the cutting apparatus 10 as illustrated in FIGS. 2 and 3, the threaded portion 62 of each leg 6 is first inserted through each boss 46 of the water pan 4 from the under side thereof. That is, an inner diameter of each boss 46 is slightly larger than a diameter of the threaded portion 62 of each leg 6, so that the threaded portion 62 is loosely fitted into each boss 46 so that an upper end portion of the threaded portion 62 projects from an upper end of each boss 46. Four tapped holes 2H are formed at the four corners of the bottom of the housing 2 so as to respectively correspond to the four bosses 46 of the water pan 4. That is, each tapped hole 2H has an internal thread adapted to engage with the external thread of the threaded portion 62 of each leg 6. As illustrated in FIG. 4A, the upper end portion of the threaded portion 62 inserted through each boss 46 is positioned at the corresponding tapped hole 2H of the housing 2, and the base 60 is then rotated to engage the upper end portion of the threaded portion 62 of each leg 6 into the corresponding tapped hole 2H. Thus, the four legs 6 are fixed to the four corners of the bottom of the housing 2. An amount of threaded engagement of the threaded portion 62 of each leg 6 with the corresponding tapped hole 2H of the housing 2 may be set arbitrarily. In setting the cutting apparatus 10, the height of the cutting apparatus 10 can be finely adjusted according to the amount of threaded engagement of the threaded portion 62 of each leg 6 with the corresponding tapped hole 2H of the housing 2. Thus, the horizontal position of the cutting apparatus 10 can be adjusted.

As illustrated in FIG. 4A, the tightening nut 64 is threadedly engaged with the threaded portion 62 of each leg 6. In mounting each leg 6 to the housing 2, the tightening nut 64 is positioned near the base 60 as illustrated in FIG. 4A. In this condition, the water pan 4 is supported through the legs 6 to the bottom of the cutting apparatus 10. However, a gap P is formed between the bottom of the housing 2 and the upper end of each boss 46, that is, between the bottom of the housing 2 and the upper ends of the front wall 41, the side wall 42, the side wall 43, and the rear wall 44.

Figure 4B:
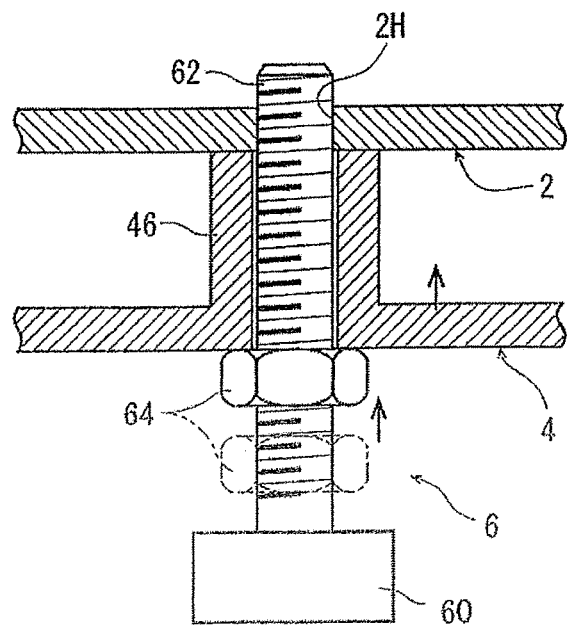
FIG. 4B is a view similar to FIG. 4A, illustrating a manner of fixing the water pan to the bottom of the cutting apparatus.

After mounting the legs 6 with the water pan 4 to the bottom of the housing 2, the tightening nut 64 is rotated to raise the water pan 4 with the tightening nut 64, thereby bringing the upper end of each boss 46 into close contact with the bottom of the housing 2 as illustrated in FIG. 4B. Accordingly, a closed space is defined between the inside surface of the water pan 4 and the bottom of the housing 2. Thus, the water pan 4 is fixed to the bottom of the cutting apparatus 10.

According to the preferred embodiment, the water pan 4 for receiving a water leaked is fixed to the bottom of the cutting apparatus 10, so that it is unnecessary to perform an operation of preparing and setting a separate water pan. Accordingly, it is unnecessary to perform any extensive operation such that the cutting apparatus 10 is lifted by using a crane or the like, so as to set the water pan, and the water pan is next inserted into a space defined below the cutting apparatus 10. Further, since the water pan 4 is fixed through the legs 6 to the housing 2 of the cutting apparatus 10, the water pan 4 can be easily mounted to the housing 2 by mounting the legs 6 to the housing 2. Further, the water pan 4 is fixed so that the bottom wall 45 is inclined with respect to a horizontal plane, and the detecting portion 72 of the water leakage sensor 70 is provided at the predetermined low position where the water leaked to the bottom wall 45 of the water pan 4 is collected. Accordingly, even when the water leakage occurs at any position in the cutting apparatus 10, the water leakage can be detected quickly.

The present invention is not limited to the above preferred embodiment, and various modifications may be made. For example, while the present invention is applied to the cutting apparatus 10 in the above preferred embodiment, the present invention is applicable to any processing apparatus using a processing water, such as a grinding apparatus and a polishing apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
    a chuck table for holding a workpiece;
    processing means for processing said workpiece held on said chuck table and supplying a processing water to said workpiece;
    a housing that at least partially encloses said processing means, said housing having a bottom; and
    a water pan fixed to the bottom of said housing and configured for receiving said processing water as a water leaked, said water pan including a side wall and a bottom wall that is inclined relative to a horizontal plane, said bottom wall including a plurality of bosses positioned adjacent to an inner surface of the side wall and forming a closed space between said water pan and said bottom of said housing, said bottom wall of said water pan having a low position, which is a position at a vertical distance from said bottom of said housing that is greater than a vertical distance of any other position from said bottom of said housing, and a discharge hole at said low position, wherein said water leaked is collected at said low position and discharged through said discharge hole.

2. The processing apparatus according to claim 1, further comprising:
    a plurality of legs provided at the bottom of said housing;
    said water pan being fixed through said legs to the bottom of said housing.

3. The processing apparatus according to claim 1, further comprising:
    a water leakage sensor for detecting the water leaked of said processing water,
    said water leakage sensor being provided at said low position to detect said processing water collected at said low position.

4. The processing apparatus according to claim 1, wherein said water pan includes a front wall, a plurality of side walls and a rear wall extending from said bottom wall, said front wall, said side walls and said rear wall forming four corners and defining an interior space, said water pan including a boss positioned at each of said four corners and in said interior space.

5. The processing apparatus according to claim 4, further comprising a plurality of legs, one of said legs is inserted through each of said bosses and secured to said bottom of said housing.

6. The processing apparatus according to claim 5, wherein each of said legs includes a threaded portion and a nut is threaded onto said threaded portion of said legs, wherein each said nut threadingly engages said water pan to move said water pan against said bottom of said housing.

7. The processing apparatus according to claim 1, further comprising a water leakage sensor for detecting the water leaked of said processing water, said water leakage sensor being positioned adjacent to said discharge hole.

8. A processing apparatus comprising:
    a chuck table for holding a workpiece;
    processing means for processing said workpiece held on said chuck table and supplying a processing water to said workpiece;
    a housing at least partially enclosing said processing means, said housing having a bottom; and
    a water pan fixed to the bottom of said housing and configured for receiving said processing water as a water leaked,
    said water pan including a side wall and a bottom wall that is inclined relative to a horizontal plane, said bottom wall including a plurality of bosses positioned adjacent to an inner surface of the side wall and forming a closed space between said water pan and said bottom of said housing, said bottom wall of said water pan having a low position, which is a position at a vertical distance from said bottom of said housing that is greater than a vertical distance of any other position from said bottom of said housing, and a discharge hole at said low position and a plurality of walls extending from said bottom wall and forming a plurality of corners, wherein said low position and said discharge hole are located at one of said corners, and wherein said water leaked is collected at said low position and discharged through said discharge hole.

9. The processing apparatus according to claim 8, further comprising a water leakage sensor for detecting the water leaked of said processing water, said water leakage sensor being positioned adjacent to said discharge hole.

* * * * *